PLASMA ANODIZING ALUMINUM COATINGS ON A SEMICONDUCTOR

Filed Jan. 19, 1968 3 Sheets-Sheet 1

Inventors:
ALBERT WAXMAN &
KARL H. ZAININGER
BY Robert P. Williams
Attorney

Inventors:
ALBERT WAXMAN &
KARL H. ZAININGER
BY Robert V. Williams
Attorney

PLASMA ANODIZING ALUMINUM COATINGS ON A SEMICONDUCTOR

Filed Jan. 19, 1968

3 Sheets-Sheet 3

Inventors:
ALBERT WAXMAN &
KARL H. ZAININGER

BY Robert P. Williams
Attorney

United States Patent Office 3,556,966

Patented Jan. 19, 1971

3,556,966
PLASMA ANODIZING ALUMINUM COATINGS ON A SEMICONDUCTOR

Albert Waxman, Trenton, and Karl H. Zaininger, Princeton, N.J., assignors to RCA Corporation, a corporation of Delaware Filed Jan. 19, 1968, Ser. No. 699,211
Int. Cl. B44d 5/12
U.S. Cl. 204—164 1 Claim

ABSTRACT OF THE DISCLOSURE

Aluminum oxide, made by depositing a layer of metallic aluminum on the surface of a body of semiconductive material and then anodizing the aluminum with ions from an oxygen plasma, is employed as an encapsulating coating and as an insulating layer in a semiconductor device. Active devices formed in the semiconductive material adjacent to the coated surface are stable and radiation resistant.

BACKGROUND OF THE INVENTION

This invention relates to semiconductor devices and to methods for their fabrication. More particularly, the invention pertains to semiconductor devices which have insulating coatings thereon, and to methods for producing such coatings.

It is common practice in the semiconductor art to coat semiconductive materials such as silicon, germanium, or gallium arsenide with genetically-derived oxides of the semiconductive material itself, or with oxides deposited by the pyrolytic decomposition of a source material. Aluminum oxide, as a semiconductor coating material, has been formed by depositing a layer of aluminum on a surface of the semiconductor and anodizing the aluminum in a liquid electrolyte.

In integrated circuits of the monolithic type and in discrete active devices, an oxide coating is used as an encapsulating medium to prevent migration of contaminants from the surrounding ambient into the semiconductive material and as an insulating support on which interconnection metallization may be placed. In insulated gate field effect transistors, which are usually fabricated from silicon, thermally-grown silicon dioxide is commonly used as the gate insulator and deposited or thermally-grown silicon dioxide is employed for protection of the device from the ambient.

Careful fabrication techniques have heretofore been required to produce oxide coatings which do not result in surface state problems in the semiconductive material adjacent to the oxide. Lack of cleanliness in the manufacture of silicon field effect devices in which the gate insulator is thermally-grown $SiO_2$ has resulted in devices which are unstable. These devices, even if made under clean conditions, have low radiation tolerances. Enhancement type field effect devices made under insufficiently clean conditions have had relatively high threshold voltages.

The wet-anodized aluminum oxide mentioned above is not satisfactory as a semiconductor coating because, among other things, charged contaminants such as sodium ions are introduced into the oxide during its formation. These contaminants are mobile and can move under the influence of heat and electric fields, thereby producing changes in the electrical characteristics of devices adjacent to the oxide.

SUMMARY OF THE INVENTION

The present novel semiconductor device is characterized by being coated with aluminum oxide produced by depositing a coating of metallic aluminum on the surface of the semiconductive material and then anodizing this coating, throughout the thickness of the aluminum layer, in an oxygen plasma.

It has been found that devices having coatings produced in this way are stable and resistant to radiation. The semiconductive material beneath the coating exhibits low surface state density and is well shielded against the ambient. Insulated gate field effect devices employing the novel aluminum oxide coating as the gate insulator thereof have relatively low threshold voltages, and are therefore particularly suitable for integrated circuit applications, because the reduction in threshold voltage lowers the power dissipation of the circuit. These devices are also particularly stable under conditions of applied bias and high temperature.

A particular advantage of the present novel method is that the ultraclean fabrication methods now commonly employed in the semiconductor art are not required. Consequently, increased yield arises from a manufacturing operation which uses this method.

THE DRAWINGS

THE PREFERRED EMBODIMENTS

Figure 1:
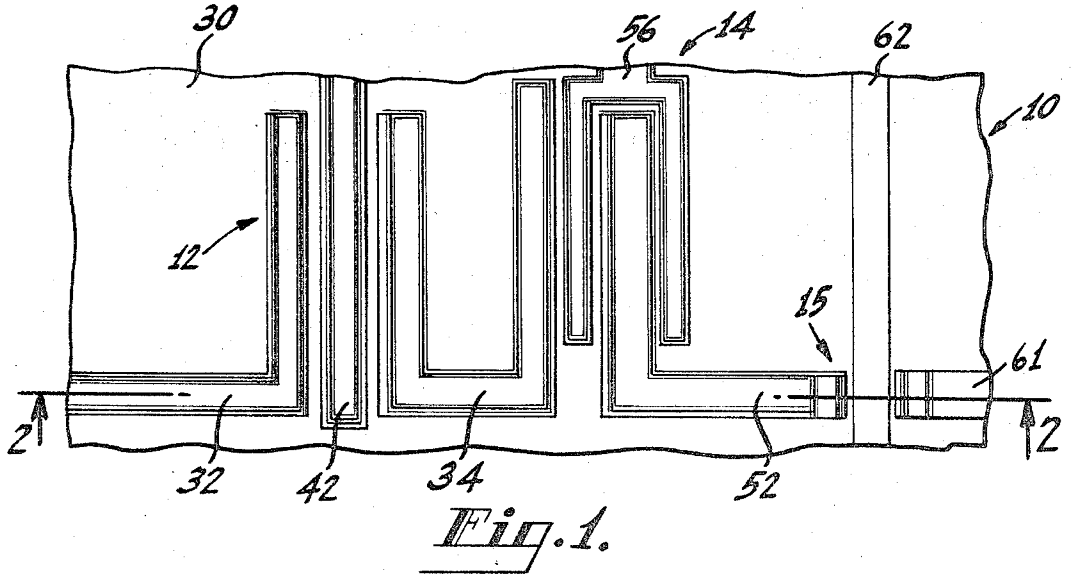
FIG. 1 is a plan view of a portion of an integrated circuit which employs the present novel aluminum oxide coating in several ways.
Figure 2:
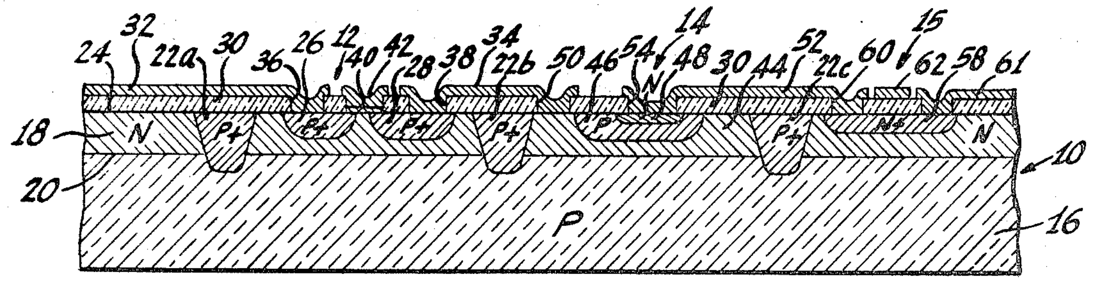
FIG. 2 is a cross section taken on the line 2—2 of FIG. 1.

FIGS. 1 and 2 illustrate a portion of an integrated circuit 10 which includes an aluminum oxide coating made by the present novel method. In this example, the integrated circuit 10 has three circuit elements in the portion illustrated in FIG. 1, namely, an insulated gate field effect transistor 12, a bipolar transistor 14, and a tunnel-type crossover 15, which appears in the lower right corner of FIG. 1 and at the right side of the integrated circuit 10 as seen in FIG. 2.

The integrated circuit 10 is fabricated in a wafer 16 of semiconductive material such as silicon, which, in this example, is of P type conductivity. An N type epitaxial layer 18 is disposed on a surface 20 of the wafer 16 and P+ type isolation diffusions 22*a*, 22*b*, and 22*c* extend from the upper surface 24 of the epitaxial layer 18 through the epitaxial layer 18 and a short distance into the P type material of the wafer 16. The techniques for the formation of the epitaxial layer 18 and the P+ isolation diffusions 22*a*, 22*b*, and 22*c* are well-known in the art.

The insulated gate field effect transistor 12 has a substrate region formed by that portion of the N type epitaxial layer 18 which lies between the isolation diffusions 22*a* and 22*b*. Within this region are two spaced P+ type regions 26 and 28 which constitute source and drain electrode regions respectively, for the transistor 12. On the surface 24 of the epitaxial layer 18 is a layer 30 of insulating aluminum oxide, made in accordance with the present novel method which will be described in detail hereinafter. Interconnection metallization layers 32 and 34 are disposed on the aluminum oxide layer 30 and have portions which extend through suitable openings 36 and 38 in the aluminum oxide layer 30 into contact with the P+ source and drain regions 26 and 28.

The gate structure of the field effect transistor 12 includes a gate insulator 40 which is a portion of the aluminum oxide layer 30, made, for example, by etching away part of the layer 30 in the space between the source and drain regions 26 and 28. A gate electrode layer 42 overlies the gate insulator 40.

The bipolar transistor 14 is located between the isolation diffusions **22*b* and 22*c*. The transistor 14 has a collector region 44 constituted by that portion of the epitaxial layer 18 which lies between the isolation diffusions 22*b* and 22*c*. Within the collector region 44 is a diffused base region 46 and within the base region 46 is a diffused emitter region 48. Portions of the aluminum oxide layer 30 are seen in FIG. 2 in overlying relation to the peripheral boundaries of the junctions formed between the collector, base and emitter regions of the transistor 14. In the present example, the interconnection metallization layer 34 extends through a suitable opening 50 in the aluminum oxide layer 30 into contact with the collector region 44 of the transistor 14. Another interconnection metallization layer 52 overlies the aluminum oxide layer 30 and extends through an opening 54 therein into contact with the emitter region 48. A base contact metallization layer 56 (FIG. 1) extends through suitable openings in the aluminum oxide layer 30 into contact with the base region 46 of the transistor 14**.

The tunnel-type crossover 15, in the region of the epitaxial layer 18 to the right of the isolation diffusion **22*c* in FIG. 2, includes a diffused N+ type region 58. The interconnection metallization 52 has a portion thereof which extends through an opening 60 in the aluminum oxide layer 30 into contact with the N+ type region 58. Another layer of metallization, 61, extends from the opposite end of the N+ type region 58. A layer of crossing metallization 62 lies on the aluminum oxide layer 30 over the N+ type region 58**.

Figure 3:
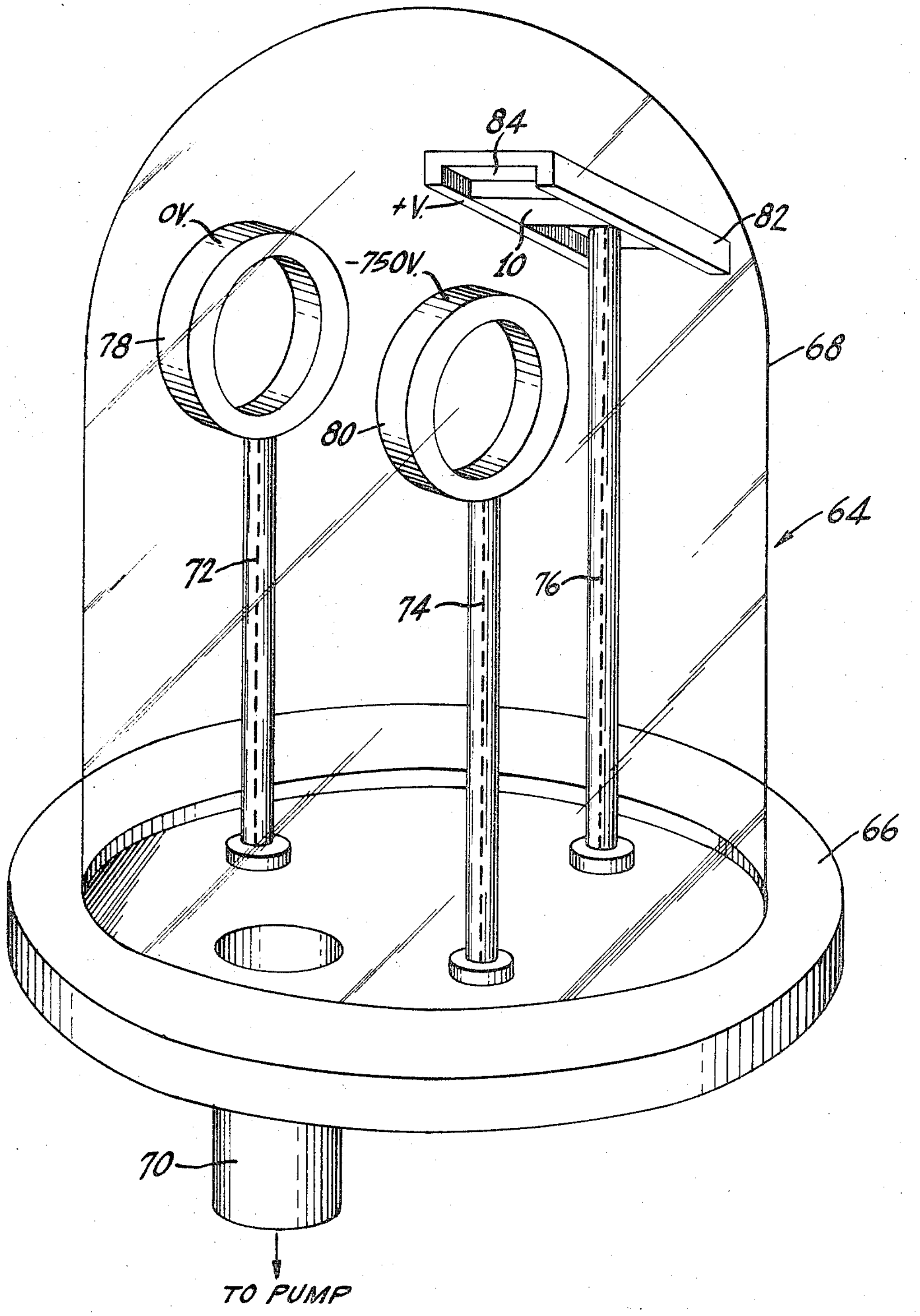
FIG. 3 is a perspective view of apparatus useful in carrying out the present novel method.

In accordance with the present novel method, the aluminum oxide coating 30 is formed by depositing a layer of pure metallic aluminum on the surface 24 of the epitaxial layer 18, by any known technique such as evaporation. Thereafter, this metallic aluminum is reactively converted to aluminum oxide by anodizing the aluminum with oxygen ions derived from a plasma. Apparatus suitable for this anodization is illustrated at 64 in FIG. 3.

The apparatus 64 comprises a vacuum system employing a support plate 66 and a glass bell jar 68. A conduit 70 communicates through the support plate 66 with the interior of the bell jar 68 and serves, when connected to suitable pumping apparatus, not shown, to exhaust the interior of the bell jar 68 and to supply desired gaseous atmospheres thereto. Within the bell jar 68 and supported by the support plate 66 are three upstanding posts 72, 74 and 76. Posts 72 and 74 support a pair of plasma electrodes 78 and 80. One electrode 80 is a cathode and is made of an annular ring of aluminum. The other electrode 78 is an anode and is also an annular aluminum ring, which is covered by a sheet of gold foil, not shown. The gold foil is employed to prevent anodic oxidation of the aluminum of the electrode 78. Suitable leads, also not shown, for providing operating voltages to the electrodes 78 and 80, may extend through the posts 72 and 74.

The post 76 carries, at its upper end, a substrate holding jig 82. The substrate holding jig 82 has a groove 84 in which an integrated circuit wafer 10 having an aluminum coating to be anodized may be placed.

In the operation of the apparatus 64, a device 10 to be anodized is first placed within the groove 84 in the holder 82. The bell jar 68 is then placed on the support surface 66, the interior thereof is evacuated, and oxygen is admitted to a pressure of approximately 300 micrometers of mercury. Next, a plasma is ignited between the electrodes 78 and 80 by establishing the anode electrode 78 at about 0 volts and the cathode electrode 80 at about —750 volts. The holder 82 and the device 10 to be anodized are biased positively with respect to the anode electrodes 78. The plasma ionizes the oxygen atoms, producing negatively charged oxygen ions which then migrate to the positively charged device 10 and react with the aluminum. After the aluminum is anodized totally through to the silicon surface 24, the wafer is removed from the vacuum system and then heat treated, preferably in an inert atmosphere such as helium, at about 300° C. The heat treatment is performed in order to remove charges trapped at the silicon-aluminum oxide interface and to relieve mechanical strains.

Figure 4:
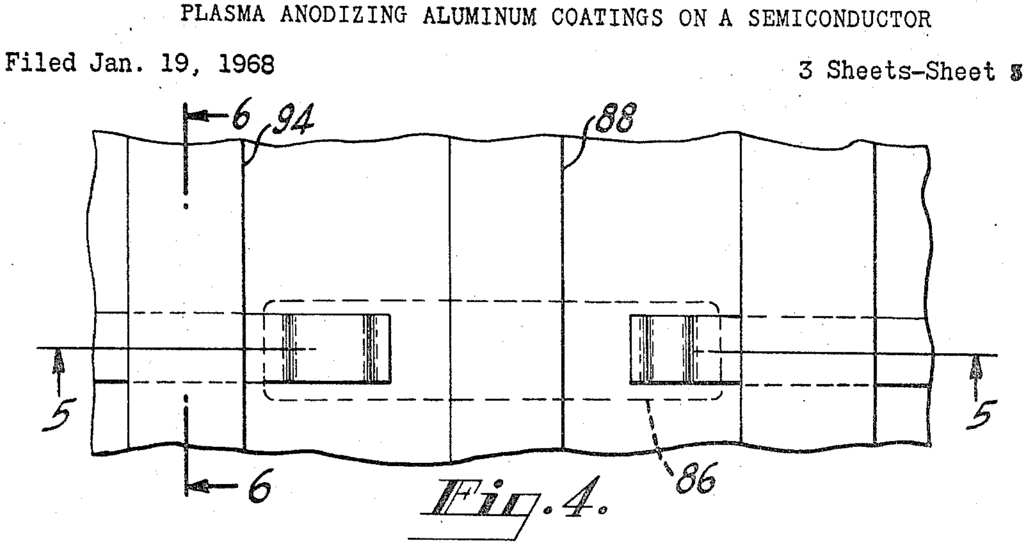
FIG. 4 is a plan view illustrating some other relationships of the present aluminum oxide coating in integrated circuits.
Figure 5:
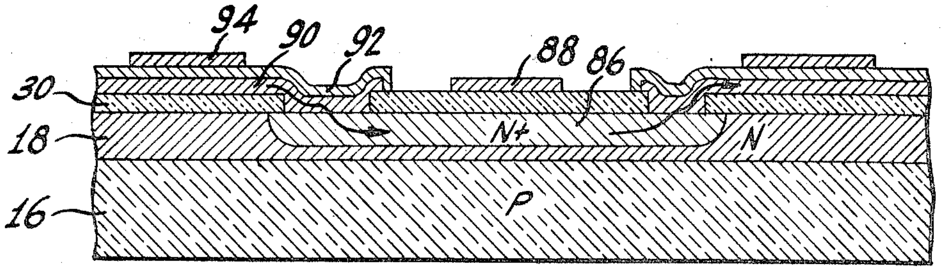
FIG. 5 is a cross section taken on line 5—5 of FIG. 4.
Figure 6:
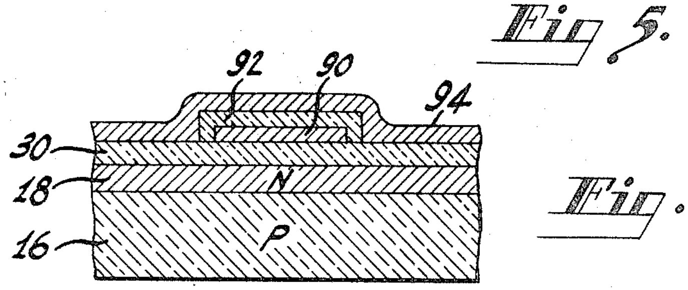
FIG. 6 is a cross section taken on the line 6—6 of FIG. 4.

FIGS. 4 and 5 illustrate a technique which may be used to provide crossover insulators of another type. As shown particularly in FIG. 5, the substrate 16 and the epitaxial layer 18 may be provided with an N+ tunnel diffusion 86. The aluminum oxide insulating layer is again designated by the reference numeral 30 in FIG. 5.

One type of crossover, which is like the crossover shown in FIG. 2, is represented by the layer of metallization indicated at 88, which is disposed on the aluminum oxide layer 30 in overlying relation to the tunnel region 86. The other form of crossover illustrated in FIG. 5, a metal-over-metal crossover, includes a layer of metallization 90, disposed on the aluminum oxide layer 30. This may be, for example, the metallization which contacts the end of the tunnel region 86. The metal layer 90 is made thicker than usual and is exposed to the plasma-derived oxygen ions in the apparatus 64 under proper voltage conditions to anodize it part way through. This partial anodization produces an aluminum oxide skin 92 on all of the exposed surfaces of the metal layer 90. A metal layer 94 may then be deposited in crossing relation to the insulated metal layer 90.

Figure 7:
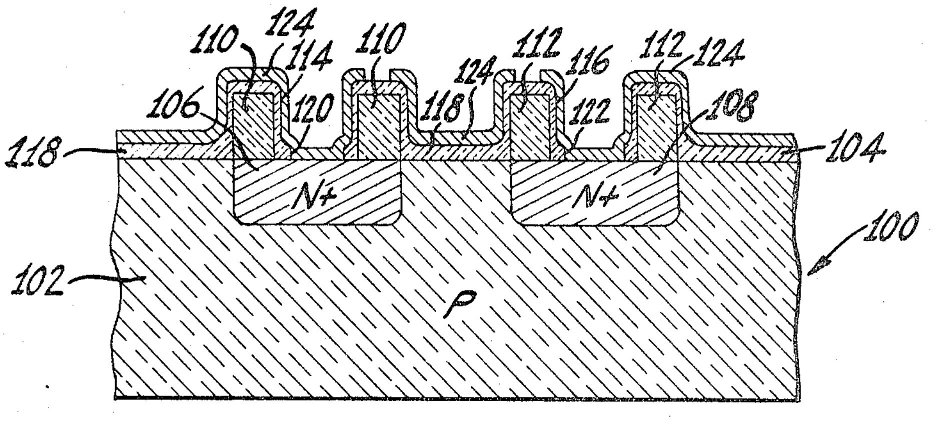
FIG. 7 is a cross sectional view through an insulated gate field effect device employing the present novel aluminum oxide coating as the gate insulator thereof.

The aluminum oxide insulation produced in accordance with the present method is compatible with other forms of semiconductor insulation. For example, FIG. 7 illustrates an insulated gate field effect transistor 100 employing both silicon dioxide and aluminum oxide in its fabrication. The transistor 100 has a substrate 102 with an upper surface 104. Adjacent to the upper surface 104 are two diffused regions 106 and 108 which are made by depositing on the surface 104 a layer of doped silicon dioxide, that is, silicon dioxide which contains conductivity modifiers for the semiconductive material. This doped oxide is selectively etched to leave blocks, indicated at 110 and 112, over the regions which are to be the source and drain regions of the transistor. The structure is then heated in a diffusion furnace, which causes the conductivity modifiers to diffuse into the substrate 102 to form the regions 106 and 108. The oxide blocks 110 and 112 at this stage in the fabrication fully cover the regions 106 and 108. Thereafter, as shown in FIG. 7, the blocks are provided with contact openings 114 and 116.

After the contact openings 114 and 116 are formed in the blocks 110 and 112, a layer of metallic aluminum is deposited over all of the exposed surfaces of the transistor 100. The device, with its aluminum coating, is then placed in the apparatus 64 and the aluminum is completely converted to an aluminum oxide layer 118. This aluminum oxide layer constitutes the gate insulator as well as the surface protecting medium for the transistor 100.

As the next step in the fabrication of the transistor 100, openings 120 and 122 are formed in the aluminum oxide layer 118 in order to expose portions of the surfaces of the source and drain regions 106 and 108. An aluminum layer 124 is then deposited and selectively etched so as to leave source and drain contact electrodes and a gate electrode for the transistor 100.

As compared to silicon dioxide, the aluminum oxide coating produced in accordance with the present method has been found to be superior in that the devices with which it is used are more stable and exhibit better radiation resistance. Exposure of silicon dioxide coated devices to high energy electrons, for example, causes charge to build up in the oxide and generates undesirable interface states. Capacitance-voltage measurements on a typical metal-oxide-semiconductor capacitor employing a thermally-grown silicon dioxide film as its dielectric show a shift, due to the accumulation of oxide charge, of about 10 volts under bombardment by 1 mev. electrons, at a fluence level of $1\times10^{13}$ e./cm.$^2$. A similar device having an aluminum oxide insulator made by the present method, when bombarded up to $1\times10^{13}$ e./cm.$^2$, exhibited no detectable charge accumulation and no generation of interface states. Fluence levels of $1\times10^{14}$ e./cm.$^2$ were required to produce a detectable charge in the aluminum oxide capacitor.

Insulated gate field effect transistors employing the present aluminum oxide film as the gate insulator thereof are stable. Enhancement type field effect transistors exhibit low threshold voltages, which make them particularly desirable for use in integrated circuits where low power dissipation is required. In a typical field effect transistor such as the transistor 100, the density of interface states has been found to be about $2\times10^{10}$ states/cm.$^2$-ev. The transconductance of a typical device is 4000 microsiemens and the threshold voltage is about 1.0 volt. When this device was subjected to a temperature of about 250° C. and a gate voltage adequate to produce a field of $1.5\times10^6$ v./cm., no evidence of any ionic motion was found. There was a shift in threshold voltage of the order of only ±0.5 volt. Typical devices employing a silicon dioxide insulator often exhibit shifts in threshold voltage of ± several volts under the same conditions.

The aluminum used to form the aluminum oxide layer was evaporated from a tungsten filament and no particular effort was made to exclude sodium or other alkali metal contaminants from the deposition apparatus. It follows, therefore, that superior devices can be made easily by the present process.

What is claimed is:

1. A method of forming a passivating coating on the surface of a body of semiconductive material comprising the steps of
   depositing a coating of aluminum metal on said surface,
   converting said aluminum coating to aluminum oxide by disposing said body, with the aluminum coating thereon, near an oxygen plasma, biasing said body positive with respect to said plasma, and
   removing said body from the vicinity of said plasma after said aluminum coating has been converted throughout its thickness, and heating said body in an inert atmosphere at about 300° C. for a sufficient time to remove trapped charge carriers from the semiconductor-aluminum oxide interface.

References Cited

UNITED STATES PATENTS

| | | | |
|---|---|---|---|
| 3,325,258 | 6/1967 | Fottler et al. | 204—192 |
| 3,350,222 | 10/1967 | Ames et al. | 117—212 |
| 3,394,066 | 7/1968 | Miles | 204—164 |
| 3,414,490 | 12/1968 | Thornton, Jr. | 204—38 |

ROBERT K. MIHALEK, Primary Examiner